United States Patent [19]

David et al.

[11] Patent Number: 5,525,761
[45] Date of Patent: Jun. 11, 1996

[54] COPPER-BASED PASTE CONTAINING REFRACTORY METAL ADDITIONS FOR DENSIFICATION CONTROL

[75] Inventors: Lawrence D. David, Wappingers Falls; Shaji Farooq; Anthony Mastreani, both of Hopewell Junction; Srinivasa S-N. Reddy, LaGrangeville; Rao V. Vallabhaneni, Wappingers Falls, all of N.Y.

[73] Assignee: International Business Machines Corporation, Armonk, N.Y.

[21] Appl. No.: 466,559

[22] Filed: Jun. 6, 1995

Related U.S. Application Data

[63] Continuation of Ser. No. 258,896, Jun. 10, 1994, which is a continuation of Ser. No. 998,137, Dec. 28, 1992.

[51] Int. Cl.⁶ ..................................................... H05K 1/09
[52] U.S. Cl. ................................................ 174/257
[58] Field of Search ..................................... 174/250, 257

[56] References Cited

U.S. PATENT DOCUMENTS

| | | | |
|---|---|---|---|
| 3,342,587 | 9/1967 | Goodrich et al. | |
| 3,549,412 | 12/1970 | Frey, Jr. et al. | 117/100 |
| 3,831,270 | 8/1974 | Huddleston | 174/257 |
| 4,020,206 | 4/1977 | Beil | 428/137 |
| 4,234,367 | 11/1980 | Herron et al. | 156/89 |
| 4,301,324 | 11/1981 | Kumar et al. | 174/68.5 |
| 4,599,277 | 7/1986 | Brownlow et al. | 428/552 |
| 4,606,941 | 8/1986 | Jenkin | 427/217 |
| 4,671,928 | 6/1987 | Herron et al. | 419/10 |
| 4,713,494 | 12/1987 | Olkawa et al. | 174/68.5 |
| 4,776,978 | 10/1988 | Herron et al. | 252/512 |
| 4,849,284 | 7/1989 | Arthur et al. | 428/325 |
| 5,172,301 | 12/1992 | Schneider | 361/386 |
| 5,229,549 | 7/1993 | Yamakawa et al. | 174/262 |

Primary Examiner—Laura Thomas
Attorney, Agent, or Firm—Ira David Blecker

[57] ABSTRACT

A copper-based paste for multilayer ceramic substrate vias and lines including copper particles as the majority constituent of the paste, a refractory metal additive selected from the group consisting of chromium, tantalum, and tungsten, and organic materials.

This copper-based paste has particular applicability to the formation of vias and lines in ceramic packages wherein the vias and lines would have a composition principally of copper with additions of the refractory metal.

6 Claims, 2 Drawing Sheets

COPPER-BASED PASTE CONTAINING REFRACTORY METAL ADDITIONS FOR DENSIFICATION CONTROL

This application is a continuation of U.S. patent application Ser. No. 08/258,896, filed Jun. 10, 1994, which is a continuation application of U.S. patent application Ser. No. 07/998,137, filed Dec. 28, 1992.

BACKGROUND OF THE INVENTION

The present invention generally relates to copper-filled vias and lines in ceramic substrates and, more particularly, to a copper-based paste containing refractory metal additions for densification control of the via and thick film lines produced by sintering.

The use of copper-filled vias in ceramic substrates, particularly multilayer ceramic substrates, and sintering processes for producing them are well known in the semiconductor packaging art as taught, for example, in Herron et al. U.S. Pat. No. 4,234,367, the disclosure of which is incorporated by reference herein. Recently, more interest has been focused on the associated problems of the disparity in shrinkage rates between copper and ceramic as well as the onset of via "opens", particularly as via diameters are reduced below 100 microns in high circuit density applications. A discussion of such problems is given in Herron et al., U.S. Pat. No. 4,776,978, the disclosure of which is incorporated by reference herein.

As set forth in the cited 4,776,978 patent, metal particles, such as copper, in the via and line paste undergo sintering while also experiencing shrinkage during the initial phase of the sintering cycle whereas the ceramic and/or glass particles (of the bulk ceramic substrate containing the vias and lines) undergo sintering during the intermediate and final phases of the sintering cycle along with their characteristic shrinkage. One method of delaying the onset of sintering of the metal particles until at least the intermediate phase of the sintering cycle is to intersperse the metal particles in the vias and lines with a high melting point material such as aluminum oxide.

Although the foregoing generalized considerations have been known in the art for some time and have provided the basis for techniques for overcoming previous shrinkage and related problems, more refined and detailed approaches are required to meet the needs of copper-filled vias and lines in ceramic substrates with increasing circuit densities and the concomitant via diameters in the range of about 85 to 100 microns. It is also desirable to provide a copper paste mixture which can be adapted for use with the next generation of ceramic packages which exhibit reduced shrinkage from sintering.

The following references illustrate previous techniques attempting to overcome shrinkage and other problems.

Brownlow et al., U.S. Pat. No. 4,599,277 discloses the addition of an organometallic compound to a metal member such as copper paste which compound undergoes decomposition during sintering to provide a coating such as aluminum oxide on the copper particles towards obtaining better shrinkage match between copper and the bulk ceramic substrate during sintering.

Beil, U.S. Pat. No. 4,020,206 discloses a low shrinkage via paste made from gold particles and refractory particles such as carbides, oxides, and quartz.

Herron et al., U.S. Pat. No. 4,671,928 discloses that molybdenum or aluminum oxide may be added to the copper paste to retard sintering and reduce densification.

Other references generally illustrate the formation of carbonyl coatings on metal particles. Thus, Goodrich et al., U.S. Pat. No. 3,342,587 disclose the deposition of nickel and iron carbonyls on copper particles. Frey et al., U.S. Pat. No. 3,549,412 and Jenkin, U.S. Pat. No. 4,606,941 disclose the formation of chromium, molybdenum, tantalum, and tungsten carbonyls on metals in general.

One purpose of the present invention is to provide a copper paste with a refractory metal addition to substantially match the shrinkage of the resulting copper material to the shrinkage, if any, during sintering of the bulk ceramic substrate.

Another purpose of the present invention is to provide a copper paste with a refractory metal addition to provide substantially reduced shrinkage after sintering of the copper material in low shrinkage porous ceramic substrates.

These and other purposes of the present invention will become more apparent after referring to the following specification.

BRIEF SUMMARY OF THE INVENTION

The purposes of the invention have been achieved by providing, according to a first aspect of the invention, a copper-based paste for multilayer ceramic substrate vias and lines comprising copper particles as the majority constituent of the paste, a refractory metal additive selected from the group consisting of chromium, tantalum, and tungsten and organic materials.

According to a second aspect of the invention, the copper-based paste may be incorporated into a ceramic substrate by forming the vias and lines with the copper-based paste and then sintering the substrate to result in a ceramic package having vias and lines comprising principally copper and the refractory metal additive.

DETAILED DESCRIPTION OF THE INVENTION

To control the shrinkage of copper-based vias and lines, the present inventors have found that an additive may be included in the copper-based paste which, upon sintering, controls or inhibits the shrinkage of the vias and lines. The additive should have negligble mutual solubility with copper, no room temperature solubility with copper, good wettability by copper, good electrical conductivity, and good stability. Further, the additive should be refractory in nature and readily availabile as a fine powder. Finally, the additive should allow easy binder removal by tolerating relatively high oxygen potentials.

Based on the above rationale, the present inventors have provided according to the invention a copper-based paste for ceramic substrate vias and lines. The paste includes copper particles as the principal or majority constituent of the paste, a refractory metal additive, and organic materials. The organic materials are those materials well known to those skilled in the art such as binder materials, plasticizers, rheological control agents, etc.

The refractory metal additive may be chromium, tantalum, or tungsten. Tungsten is preferred, as tantalum and chromium are difficult to use because they are not as compatible with the high oxygen partial pressures required for efficient binder burnout as is tungsten.

Figure 1:
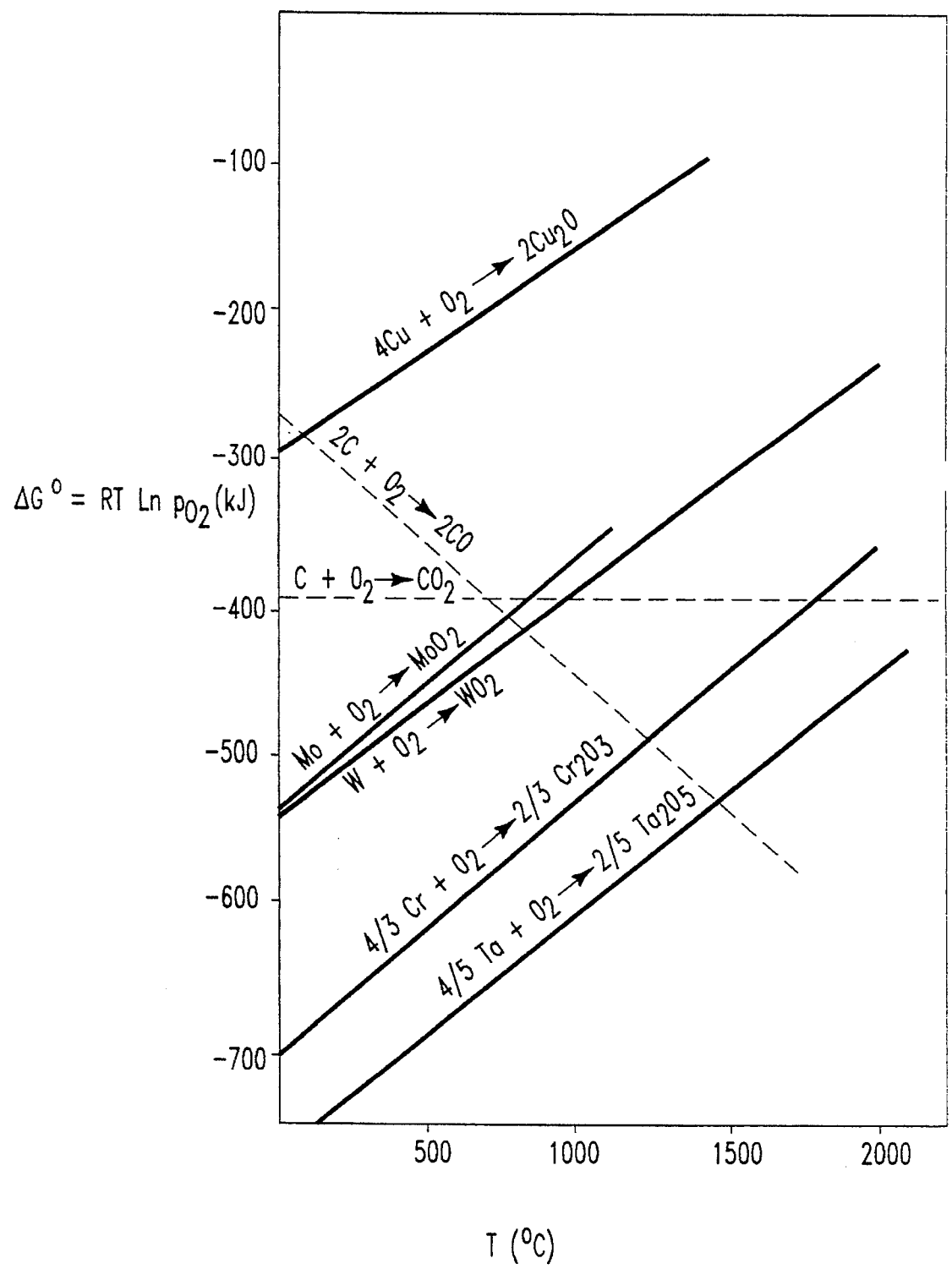
FIG. 1 is a diagram of the partial pressure of oxygen versus temperature for copper and certain refractory metal additives.

Referring to FIG. 1, there is shown a plot of oxygen partial pressure versus temperature for copper, molybdenum, tungsten, chromium, and tantalum. The line for tungsten is relatively close to copper, so it is expected that binder burnout will proceed without undue oxidation of the tungsten. Oxidation of the refractory metal additive is undesirable and to be avoided since it causes a volumetric change in the via or line (perhaps resulting in cracking of the substrate) as well as reducing its conductivity. Chromium and tantalum are difficult to sinter with copper due to their tendencies, to form oxides at very low partial pressures of oxygen. Nevertheless, chromium and tantalum may be useful in small amounts or if the oxide form of the refractory metal additive can be tolerated.

Normally, molybdenum would be expected to be useful in the present invention, but it has been found that molybdenum actually enhances densification in the presence of higher oxygen potential, rather than inhibiting it. Therefore, molybdenum is not suitable for the present invention.

The amount of refractory additive needed will be a strong function of its particle size. In general, the amount of refractory additive needed is directly proportional to its particle size and inversely proportional to that of the copper particles. As a comparison, when the refractory additive is present as a discrete particle, the particle size is on the order of 1 micron or more whereas the particle size is submicron (e.g., 0.5 micron or less) when it is present as a coating. Thus, smaller amounts of the refractory additive are needed if the barrier material can be coated onto the copper particles.

It has been found that at small amounts of the refractory additive, grain size control is the predominant effect. Grain size control can thus become a valuable result of the present invention even before shrinkage control is apparent.

Generally speaking, the refractory metal additive may be added to the paste in an amount as small as 0.4 weight percent based on the solids content of the paste; that is, the solids content includes the copper particles and refractory metal additive but excludes the organic materials. The maximum amount of refractory metal additive may go as high as 30 weight percent but preferably is no higher than about 20 weight percent, based on the solids content of the paste.

These values will change somewhat depending on the particle size. Thus, for the typical addition of 1 micron (or larger) refractory metal particles, the preferred range is 1 to 30 weight percent (based on the solids content of paste) and more preferably is 1 to 20 weight percent, since at amounts greater than about 20 weight percent, there may be too much porosity in the resulting product. For copper particles coated with submicron refractory metal particles, the preferred range is 0.4 to 4 weight percent, again based on the total solids content of the paste.

The minimum known amount of refractory metal additive for grain size control is 0.4 to 1 weight percent with the smaller amount being for the smaller particle sizes. It is believed, however, that smaller amounts will be effective in controlling grain size.

Grain size control aids in avoiding opens (breaks) in the sintered copper vias and circuits, which have been experienced using other paste additives which produce much larger copper grain sizes after sintering. Further, the growth of large grains in copper is not desirable from the point of view of reliability. The reason for this is that the plasticity of copper varies with the orientation of two neighboring large copper grains and the grains may separate when they are cooled down from high temperature and on subsequent thermal cycling. Inasmuch as the conductor size in both the vias and surface tines is about 70 to 100 microns, it is desirable to keep the copper grain size after sintering as small as possible, namely about 5 to 15 microns.

At amounts of refractory metal additive greater than about 0.4 to 1 weight percent, shrinkage control will begin to predominate. At about 4 weight percent, for the submicron refractory metal particles, and about 30 weight percent, for the 1 micron and larger refractory metal particles, shrinkage control is nearly perfect. The result after sintering, however, is often a brittle via or line. Accordingly, acceptable shrinkage control along with satisfactory strength requirements may be obtained with about 2 to less than 4 weight percent, for the submicron refractory metal particles, and 10 to less than 30 weight percent, for the larger refractory metal particles.

As is apparent, the effects of grain size control and shrinkage control may advantageously overlap at the small amounts of refractory metal additive contemplated by the present invention.

Figure 2:
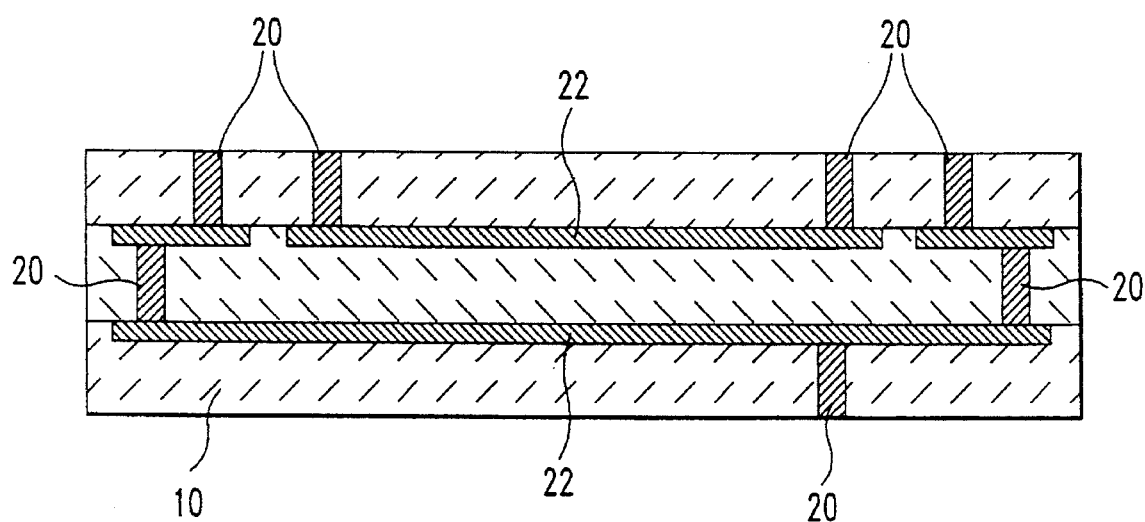
FIG. 2 is a cross-sectional view showing a multilayer ceramic substrate having co-fired vias and lines.

In use, the copper-based paste according to the present invention is screened onto a ceramic greensheet to form vias and/or lines and then sintered. Referring now to FIG. 2, there is shown a multilayer ceramic substrate 10 having co-fired vias 20 and lines 22. The greensheet may comprise a variety of materials including, but not limited to, mullite, borosilicate glass, cordierite glass, other ceramic materials, etc. The cordierite glass ceramic materials, such as that disclosed in Kumar et al., U.S. Pat. No. 4,301,324, the disclosure of which is incorporated by reference herein, are preferred. Preferably, the copper powder has an average particle size of about 5 to 8 microns.

The resultant vias and lines have a composition that is mostly copper with smaller amounts of the refractory metal additive. The precise composition will track closely to that of the solids content of the paste.

For smaller amounts of the refractory metal additive, the bulk ceramic material may be allowed to densify to 90% or more of theoretical density. For larger amounts, especially where shrinkage control is apparent, the bulk ceramic preferably is porous to aid in binder burnoff. In the case of a zero shrinkage ceramic substrate, the pore structure remains open throughout, making it possible to achieve binder burnout at higher temperatures. The higher temperature can compensate for the lower oxygen partial pressure required to protect tungsten from oxidation due to an enhancement in binder removal kinetics. Consequently, tungsten, and to a lesser extent chromium and tantalum, can be used to control densification.

As mentioned previously, the refractory metal additive may be present as a coating on the copper particles. The preferred method of coating the copper powders with tungsten, chromium, and tantalum is by dissolving the appropriate organometallic complex in an organic solvent, slurrying the copper powder in the solution, removing the solvent at room temperature and below 1 atmosphere pressure, and decomposing the organometallic to obtain the corresponding metallic coating on the surface of the copper particles. Air-stable organometallic complexes are preferred for ease of handling and scaleups. Low boiling point, non-polar solvents are the best solvents for non-polar, molecular complexes and such solvents are more easily removed. Solvent removal must be done at low temperatures and pressures to minimize losses of the complexes by sublimation.

The best choice of complexes which meet the above requirements are the metal carbonyls, $W(CO)_6$ and $Cr(CO)_6$. Tantalum does not exist as a zero-valent metal carbonyl, but is available as $C_5H_5Ta(CO)_4$. These compounds are readily available and are soluble in solvents such as THF. Other complexes which decompose to zero-valent metals, such as bis(arenes) or phosphine-substituted complexes, may also be feasible, but one major consideration is the volatility of the byproducts of decomposition of the complexes. In the case of carbonyls, thermal decomposition results in the formation of carbon monoxide which is volatile and will not contaminate the powder or its coating. The use of metal carbonyls with no other ligands is therefore preferable.

The advantages of the present invention will become more apparent after referring to the following examples.

EXAMPLES

Example I

A series of pellet samples was made in the following manner.

Copper particles of 6 micron size were mixed with tungsten particles of 1 micron size and conventional organic materials and then pressed into pellets. The pellets contained 0, 10, 20, or 30 weight percent tungsten, based on the solids content of the pellets. The pellets were then sintered according to the following schedule: ramp up to 1000° C. in 10% dry forming gas to accomplish pyrolysis, hold at 1000° C. for 40 hours in an atmosphere of 10% wet forming gas for binder burnoff, hold at 1000° C. for 4 hours in dry forming gas to ensure complete reduction of any residual oxides, followed by cooldown to room temperature. The dew point of the wet forming gas was such that tungsten oxidation was avoided.

The percentage of linear shrinkage and resistivity for each of the samples is tabulated in Table I.

TABLE I

| W, Wt. Percent | Linear Shrinkage, % | Restivity, μ ohm-cm |
| --- | --- | --- |
| 0 | 15.4 | 2.0 |
| 10 | 5.8 | 4.0 |
| 20 | 3.7 | 4.5 |
| 30 | 2.5 | 5.0 |

As can be seen from Table I, increasing amounts of tungsten dramatically decrease the shrinkage of the pellets and yet the resistivity does not increase proportionately.

Example II

A series of pellet samples were made using copper coated with tungsten particles.

The coating of the copper particles is accomplished in the following manner. Tungsten hexacarbonyl is first dissolved in THF and then slurried with copper powder. The THF is stripped on a rotary evaporator at room temperature. The stripping operation is halted just as the powder reaches dryness to avoid unnecessary sublimation of the hexacarbonyl. The coated powder is then decomposed in a completely filled pressure bomb at 300° C., to yield copper coated with submicron particles of tungsten.

The coated copper particles were then mixed with suitable and conventional paste additives, pressed into pellets and sintered. The pellets contained 0, 0.4, 2.0, or 4.0 weight percent tungsten, based on the solids content of the pellets. The sintering cycle was as follows: ramp up to 1000° C. in dry 10% forming gas for pyrolysis, hold at 1000° C. for 4 hours in an atmosphere of wet forming gas for binder burnoff, hold at 1000° C. for 4 hours in dry forming gas to ensure complete reduction of any residual oxides, then cooldown to room temperature.

Each of the pellets was measured for percentage of linear shrinkage. The results are illustrated in Table II.

TABLE II

| W, Wt. Percent | Linear Shrinkage, % |
| --- | --- |
| 0 | 15.4 |
| 0.4 | 14.6 |
| 2.0 | 3.0 |
| 4.0 | 1.5 |

A comparison of Tables I and II will demonstrate that the copper coated with tungsten particles achieves comparable (or even better) shrinkage control with smaller amounts of the refractory metal additive.

Example III

A single pellet sample was made with copper particles and 10 weight percent of 2 micron molybdenum powder. The sintering cycle was the same as that described in Example I. It was observed that about 10–11% shrinkage occurred. This should be compared to the 5.8% shrinkage for the tungsten particles of Example I.

While this data is extremely limited, it is believed that further experiments would justify the conclusion that molybdenum is inferior to tungsten in controlling shrinkage of metallic vias and lines.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A co-fired ceramic package comprising a multilayer ceramic substrate having co-fired vias and lines therein, the composition of the vias and lines comprising copper particles as the majority constituent and a refractory metal additive selected from the group consisting of chromium, tantalum, and tungsten, said ceramic package characterized by reduced grain size and shrinkage of the vias and lines as compared to a ceramic package without the refractory metal additive.

2. The ceramic package of claim 1 wherein said refractory metal additive is added in a small but effective amount to control grain size growth of the copper particles.

3. The ceramic package of claim 1 wherein said refractory metal additive constitutes 0.4 to 30 weight percent of the composition of said vias and lines.

4. The ceramic package of claim 1 wherein the amount of said refractory metal additive is 0.4 to 20 weight percent.

5. The ceramic package of claim 1 wherein said refractory metal additive is added as a particulate in the amount of 1 to 30 weight percent of the composition of said vias and lines.

6. The ceramic package of claim 5 wherein said amount is 1 to 20 weight percent.

* * * * *